United States Patent [19]

Kuwana

[11] Patent Number: 5,065,159
[45] Date of Patent: Nov. 12, 1991

[54] DIGITAL TO ANALOG CONVERTER WITH SWITCHING LOGIC MINIMIZATION

[75] Inventor: Kiyohisa Kuwana, Yokohama, Japan

[73] Assignee: Kabushiki Kaisha Toshiba, Kawasaki, Japan

[21] Appl. No.: 604,241

[22] Filed: Oct. 29, 1990

[30] Foreign Application Priority Data

Oct. 31, 1989 [JP] Japan ................................. 1-281760

[51] Int. Cl.$^5$ ............................................. H03M 1/76
[52] U.S. Cl. .................................... 341/148; 341/136; 341/154
[58] Field of Search ............... 341/136, 141, 144, 147, 341/148, 153, 154

[56] References Cited

U.S. PATENT DOCUMENTS

| | | | |
|---|---|---|---|
| 4,146,882 | 3/1979 | Hoff, Jr. et al. | 341/148 |
| 4,352,092 | 9/1982 | Masuda et al. | 341/136 |
| 4,462,021 | 7/1984 | Watanabe et al. | 341/144 |
| 4,523,180 | 6/1985 | Kuboki et al. | 341/148 |
| 4,667,178 | 5/1987 | Ryu | 341/136 |
| 4,918,448 | 4/1990 | Hauviller et al. | 341/136 X |
| 5,014,054 | 5/1991 | Oshita et al. | 341/145 |

Primary Examiner—Howard L. Williams
Attorney, Agent, or Firm—Finnegan, Henderson, Farabow, Garrett and Dunner

[57] ABSTRACT

A plurality of resistors are connected between a source terminal to which a reference voltage is applied and a grounded terminal. A plurality of switches, which constitute a first switch group and derives voltages divided by the resistors, are respectively connected to the odd-numbered connection nodes among the connection nodes between the grounded terminal and a resistor and between each adjacent resistors. A plurality of switches, which constitute a second switch group and derives voltages divided by the resistors, are respectively connected to the even-numbered connection nodes among the connection nodes between the grounded terminal and a resistor and between each adjacent resistors. Each of the switches of the first and second switch groups is connected to a logical circuit serving as a decoder for selecting one of the switches in accordance with the content of bits other than the least significant bit of an input digital signal. The first and second switch groups are connected to a third switch group which selects the first or second switch in accordance with the content of the least significant bit of the digital signal.

9 Claims, 5 Drawing Sheets

DIGITAL TO ANALOG CONVERTER WITH SWITCHING LOGIC MINIMIZATION

BACKGROUND OF THE INVENTION

1. Field of the Invention

This invention relates to a D/A converter for use in various electronic devices, more particularly to a D/A converter suitable for use in an integrated circuit.

2. Description of the Related Art

FIG. 5 shows a conventional resistance-type potential dividing D/A converter. Terminal 51 is supplied with reference voltage Vref, and terminal 52 is grounded. Resistors $R2^0$-$R2^k$ having the same resistance are connected in series between terminals 51 and 52. One ends of switches $SW2^0$-$SW2^k$ for deriving divided voltages are connected between each adjacent pair of resistors $R2^0$-$R2^k$ and to terminal 52. The other ends of switches $SW2^0$-$SW2^k$ are connected to output terminal 54 via impedance converter 53.

Input terminal 55 is supplied with digital signal Ds, and connected to decoder 56. Decoder 56 comprises logical circuits $L2^0$-$L2^k$, each of which is constituted by a NAND circuit and the like, and which are connected to the switches $SW2^0$-$SW2^k$, respectively. The digital signal supplied to input terminal 55 is decoded by these logical circuits $L2^0$-$L2^k$, the decoded outputs switch the corresponding switches $SW2^0$-$SW2^k$, and an analog voltage corresponding to the input digital signal is output from output terminal 54.

The above conventional D/A converter needs to have more resistors to process input data formed of more bits. The more resistors, the more switches and logical circuits are required. Since a logical circuit constituting a decoder has a lot of elements, an increase in the number of logical circuits results in a great increase of the size of the D/A converter. Hence, when a D/A converter is incorporated in an LSI using MOS transistor, it occupies a large area on the LSI chip, resulting in a high manufacturing cost.

SUMMARY OF THE INVENTION

It is an object of the present invention to provide a D/A converter which does not require logical circuits to increase in number to process input data formed of an increased number of bits, whereby the area occupied by the D/A converter on the integrated circuit can be prevented from increasing.

The above object is achieved by a D/A converter comprising: a plurality of resistors connected in series between first and second reference power sources; first deriving means constituted by a plurality of deriving elements for deriving divided voltages from even-numbered connection nodes among the connection nodes between each adjacent pair of resistors and the second reference power source; second deriving means constituted by a plurality of deriving elements for deriving divided voltages from odd-numbered connection nodes among the connection nodes between each adjacent pair of resistors; first selection means for selecting one of the deriving elements of the first or second deriving means in accordance with the content of bits other than an end bit of a digital signal; and second selection means for selecting one of the first and second deriving means in accordance with the content of the end bit of the digital signal.

In the above structure, the first selection means selects one of the deriving elements of the first or second deriving means, and the second selection means selects one of the first and second deriving means. Hence, even when the number of bits of a digital signal increases, the logical Circuits constituting the first selection means are prevented from increasing in number. Thus, when the D/A converter of the invention is incorporated in an integrated circuit, the area of the converter which occupies the IC chip can be kept small.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A first embodiment of the present invention will be described below with reference to the accompanying drawings.

Figure 1:
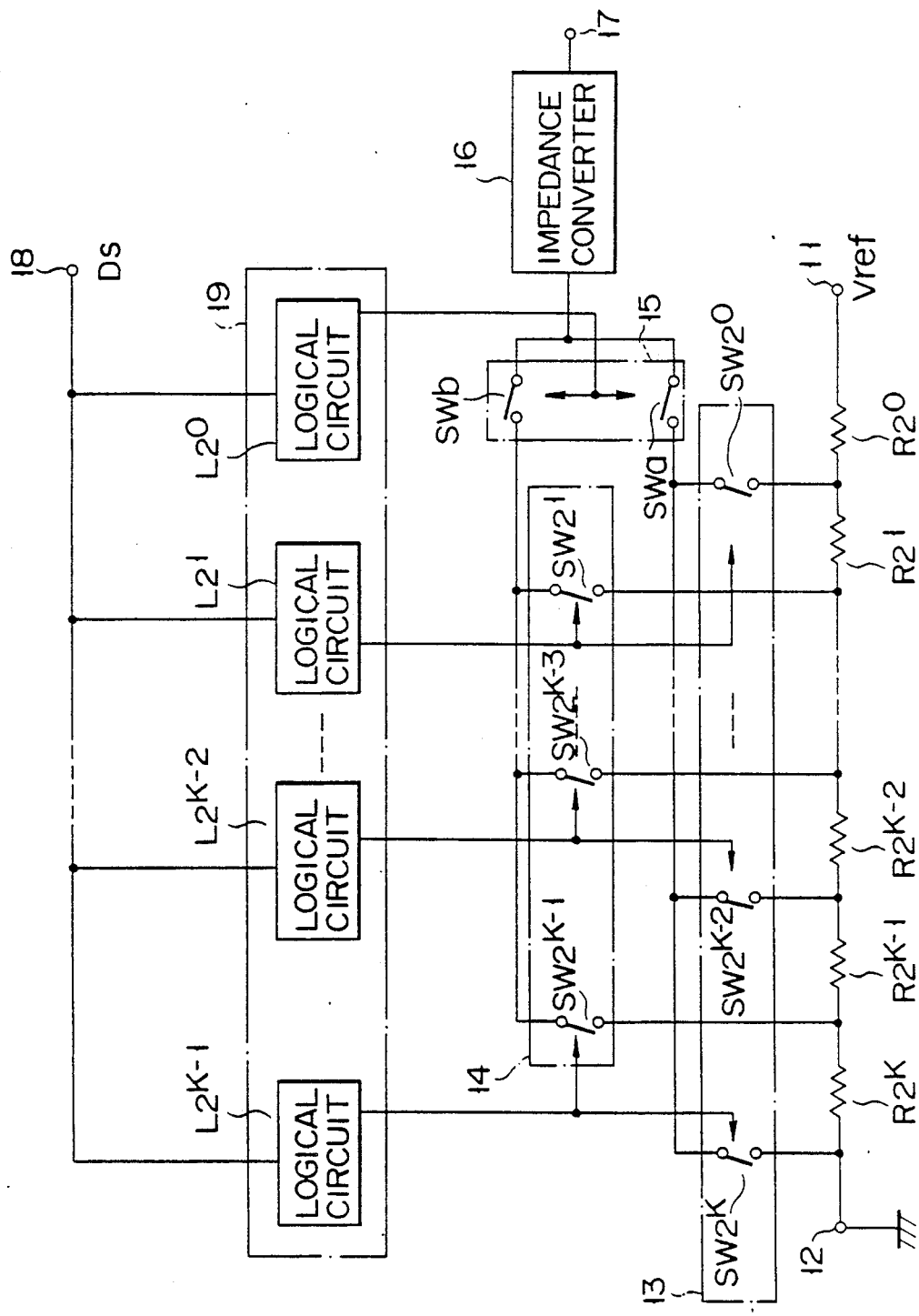
FIG. 1 is a schematic diagram showing a D/A converter according to a first embodiment of the present invention.

As shown in FIG. 1, resistors $R2^0$-$R2^k$ are connected in series between terminal 11 supplied with reference voltage Vref and grounded terminal 12. These resistors $R2^0$-$R2^k$ are connected to first and second switch groups 13 and 14 for deriving divided voltages.

First switch group 13 is constituted by switches $SW2^0$-$SW2^k$. An end of switch $SW2^0$ is connected to the connection node between resistors $R2^0$ and $R2^1$; an end of switch $SW2^{k-2}$ to the connection node between resistors $R2^{k-2}$ and $R2^{k-1}$; and an end of switch $SW2^k$ to the connection node between resistor $R2^k$ and terminal 12.

Second switch group 14 is constituted by switches $SW2^1$-$SW2^{k-1}$. An end of switch $SW2^1$ is connected to the connection node between resistors $R2^1$ and $R2^2$ (not shown); an end of switch $SW2^{k-3}$ to the connection node between resistors $R2^{k-3}$ and $R2^{k-2}$; and an end of switch $SW2^{k-1}$ to the connection node between resistor $R2^{k-1}$ and $R2^k$.

Third switch group 15 constituted by switches SWa and SWb selects one of the above-mentioned first and second switch groups 13 and 14. To achieve this selection, an end of switch SWa of third switch group 15 is connected to the other ends of switches $SW2^0$-$SW2^{k-2}$ and $SW2^k$ constituting first switch group 13, and an end of switch SWb is connected to the other ends of switches $SW2^1$-$SW2^{k-3}$ and $SW2^{k-1}$ constituting second switch group 14. The other ends of switches SWa and SWb are connected to output terminal 17 via impedance converter 16.

Input terminal 18 receives digital signal $D_S$, and connected to decoder 19 constituted by logical circuits $L2^0$-$L2^{k-1}$. Decoder 19 selectively controls first switch group 13 or second switch group 14 in accordance with data of the bits other than the LSB of digital signal $D_S$, and controls third switch group 15 in accordance with data of the LSB of digital signal $D_S$. In other words, data the LSB of digital signal $D_S$ is supplied to logical circuit $L2^0$ of decoder 19, and data of the other bits of digital signal $D_S$ is supplied to logical circuits $L2^1$-$L2^{k-1}$.

Logical circuit $L2^0$ controls switches SWa and SWb, logical circuit $L2^1$ controls switches $SW2^0$ and $SW2^1$, logical circuit $L2^{k-2}$ controls switches $SW2^{k-2}$ and $SW2^{k-3}$, and logical circuit $L2^{k-1}$ controls switches $SW2^k$ and $SW2^{k-1}$.

In the above-described structure, digital signal $D_S$ supplied via input terminal 18 is decoded by logical circuits $L2^0$-$L2^{k-1}$, switches $SW2^0$-$SW2^k$ are operated in accordance with the output of the decoder, and first or second switch group 13 or 14 is selected by third switch group 15. Through these operations, an analog voltage corresponding to the input digital signal is output from output terminal 17 via impedance converter 16. When Xth switch is turned on in response to digital signal D S, a voltage of $XVref/2^K$ ($K=0, 1, 2, \ldots 2^{k-1}$) is output from output terminal 17.

Figure 2:
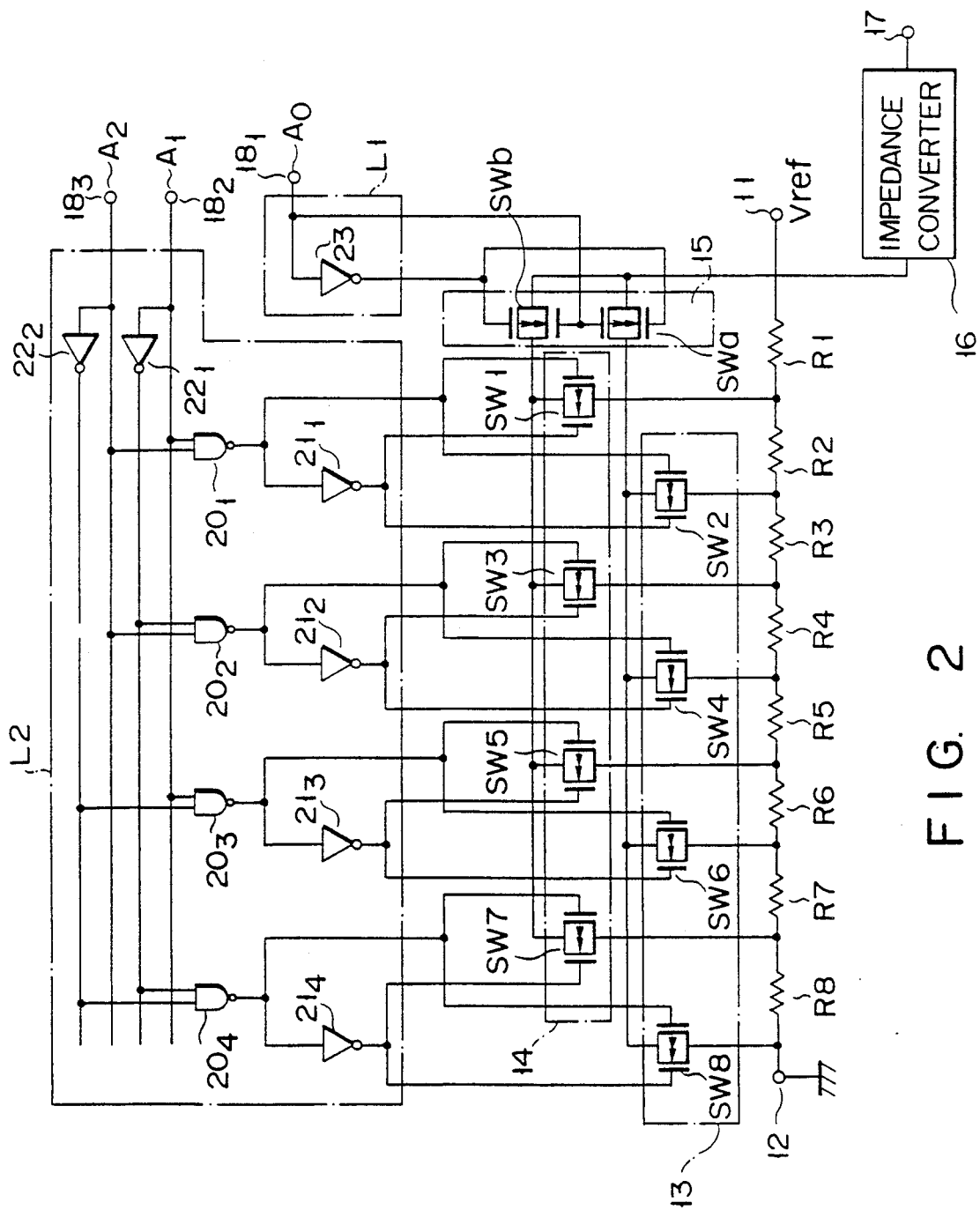
FIG. 2 is a circuit diagram more specifically showing the D/A converter shown in FIG. 1.

FIG. 2 is a circuit diagram of a 3-bits D/A converter in which the present invention is applied. In FIG. 2, the same elements as in FIG. 1 are identified by the same reference numerals.

In FIG. 2, resistors R1-R8 are connected between terminal 11 which receives reference voltage Vref and the grounded terminal 12. First switch group 13 is constituted by switches SW2, SW4, SW6, and SW8, each comprising P- and N-channel transistors. An end of switch SW2 is connected to the connection node between resistors R2 and R3; an end of switch SW4 to the connection node between resistors R4 and R5; an end of switch SW6 to the connection node between resistors R6 and R7; and an end of switch SW8 to the connection node between resistor R8 and terminal 12.

Second switch group 14 is constituted by switches SW1, SW3, SW5, and SW7, each comprising P- and N-channel transistors. An end of switch SW1 is connected to the connection node between resistors R1 and R2; an end of switch SW3 to the connection node between resistors R3 and R4; an end of switch SW5 to the connection node between resistors R5 and R6; and an end of switch SW7 to the connection node between resistors R7 and R8.

The other ends of switches SW2, SW4, SW6, and SW8 constituting first switch group 13 are connected to an end of switch SWa of third switch group 15, and the other ends of switches SW1, SW3, SW5, and SW7 constituting second switch group 14 are connected to an end of switch SWb of third switch group 15.

Input terminal $18_1$ which receives the LSB of a digital signal is connected via logical circuit L1 to third switch group 15. More specifically, input terminal $18_1$ is connected to the gates of the P-channel transistor of switch SWa and the N-channel transistor of switch SWb of third switch group 15, and also connected via inverter 23 to the gates of the N-channel transistor of switch SWa and the P-channel transistor of switch SWb.

Input terminals $18_2$ and $18_3$ which receive a signal consisting of the bits other than the LSB are connected to switches SW1-SW8 constituting first and second switch groups 13 and 14 via logical circuit L2 comprising NAND circuits $20_1$-$20_4$ and inverter circuits $21_1$-$21_4$, $22_1$, and $22_2$.

An input terminal of NAND circuit $20_1$ of logical circuit L2 is connected to input terminal $18_2$, and the other input terminal thereof is connected to input terminal $18_3$. The output terminal of NAND circuit $20_1$ is connected to the gates of the P-channel transistors of SW1 and SW2, and to the gates of the N-channel transistors of switches SW1 and SW2 via inverter circuit $21_1$.

An input terminal of NAND circuit $20_2$ is connected to the output terminal of inverter circuit $22_1$ whose input terminal is connected to input terminal $18_2$, and the other input terminal thereof is connected to input terminal $18_3$. The output terminal of NAND circuit $20_2$ is connected to the gates of the P-channel transistors of switches SW3 and SW4, and to the gates of the N-channel transistors of switches SW3 and SW4 via inverter circuit $21_2$.

An input terminal of NAND circuit $20_3$ is connected to input terminal $18_2$, and the other input terminal thereof is connected to the output terminal of inverter circuit $22_2$ whose input terminal is connected to input terminal $18_3$. The output terminal of NAND circuit $20_3$ is connected to the gates of the P-channel transistors of switches SW5 and SW6, and to the gates of the N-channel transistors of switches SW5 and SW6 via inverter circuit $21_3$.

An input terminal of NAND circuit $20_4$ is connected to the output terminal of inverter circuit $22_1$, and the other input terminal thereof is connected to the output terminal of inverter $22_2$. The output terminal of NAND circuit $20_4$ is connected to the gates of the P-channel transistors of switches SW7 and SW8, and to the gates of the N-channel transistors of switches SW7 and SW8 via inverter circuit $21_4$.

In the converter as described above, when signals A0="0", A1="0", A2="1" supplied to input terminals $18_1$, $18_2$ and $18_3$, respectively, only the output of NAND circuit $20_4$ is "0", with the result that switches SW7 and SW8 are turned on. In addition, since signal A0 is "0", a voltage $\frac{1}{3}^3$ Vref is output from output terminal 17.

In the above embodiment, the switches in first switch group 13 and the switches in second switch group 14 are alternately connected between adjacent pair of the resistors connected in series, the switches in first and second switch groups 13 and 14 are switched by use of a signal consisting of the bits other than the LSB of an input digital signal, and third switch group 15 for switching first and second groups 13 and 14 are controlled by use of the LSB of the input digital signal. Hence, the number of the logical circuits in the present invention can be smaller than that in the conventional converter, if the numbers of bits of the digital signal are the same in the two cases. Accordingly, when the D/A converter of the present invention is incorporated in an integrated circuit, the area of the D/A converter which occupies the IC chip can be reduced as compared to the conventional case.

Figure 3:
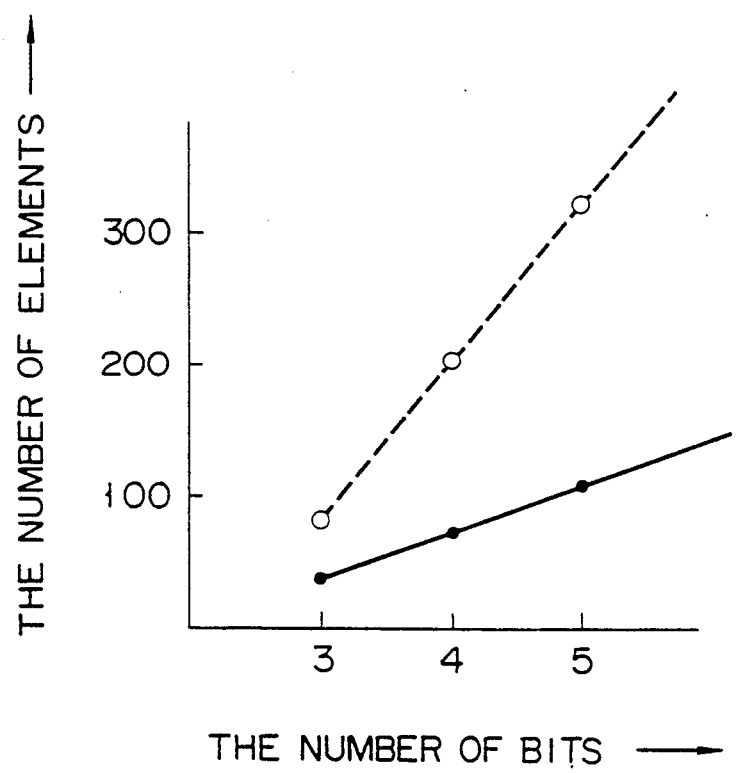
FIG. 3 is a graph showing the numbers of the elements of D/A converters according to the present invention and the conventional art.

FIG. 3 shows the relationship between the number of bits and the number of elements according to the present invention and the conventional art. As clearly shown in FIG. 3, the number of elements in the present invention is half or less than that in the conventional art, even when the number of bits is increased. Thus, the present invention is quite advantageous to reduce the area of the A/D converter on the chip, and it is possible to manufacture a compact chip at a low cost.

In the first embodiment, first and second switch groups 13 and 14 are controlled by use of the bits other than the LSB of an input digital signal, and third switch group 15 is controlled by use of the LSB of the input digital signal. However, it is possible that third switch group 15 can be controlled by use of the MSB of an input digital signal, and first and second switch groups 13 and 14 can be controlled by use of the bits other than the MSB of the input digital signal.

Figure 4:
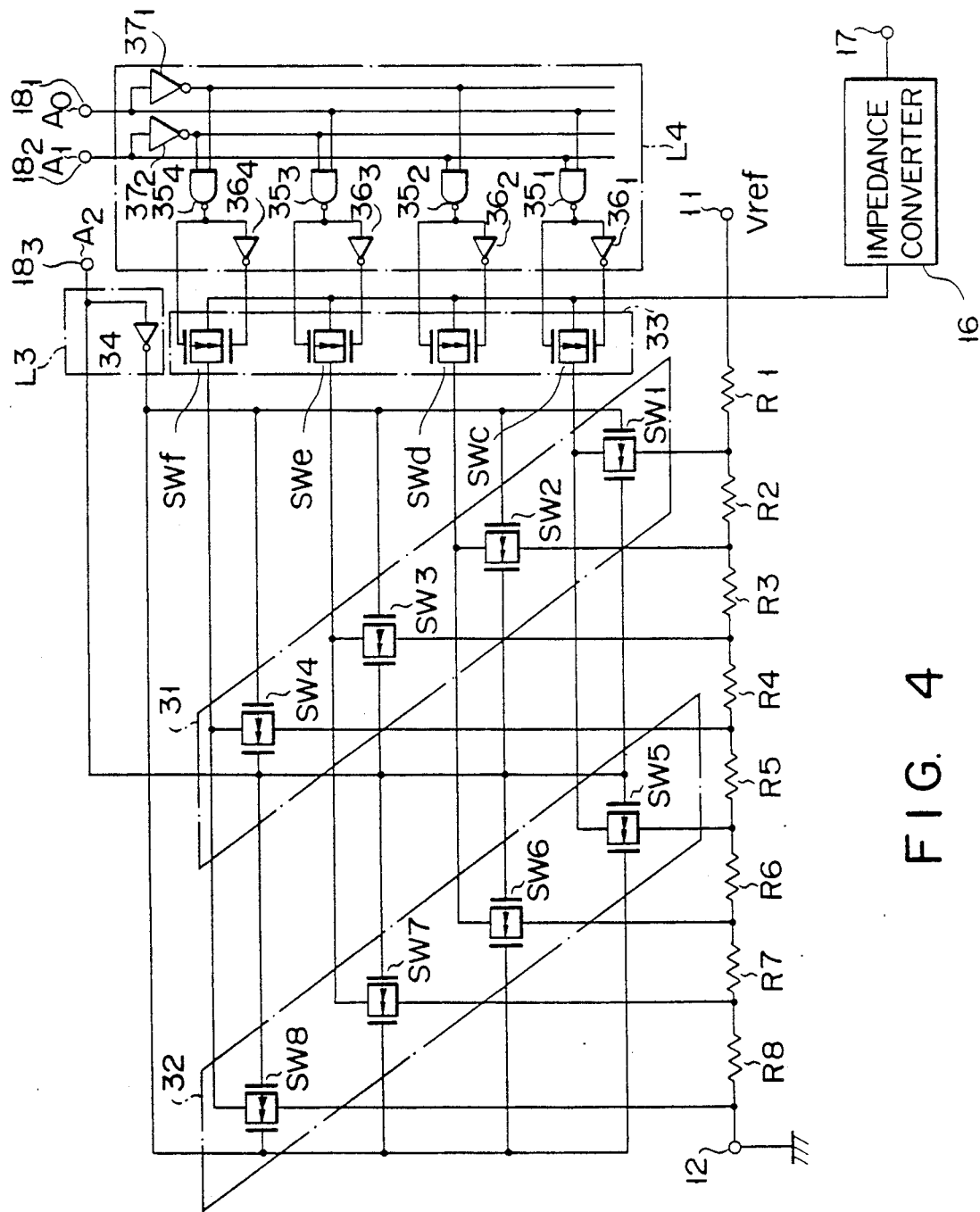
FIG. 4 is a circuit diagram showing a D/A converter according to a second embodiment of the present invention.
Figure 5:
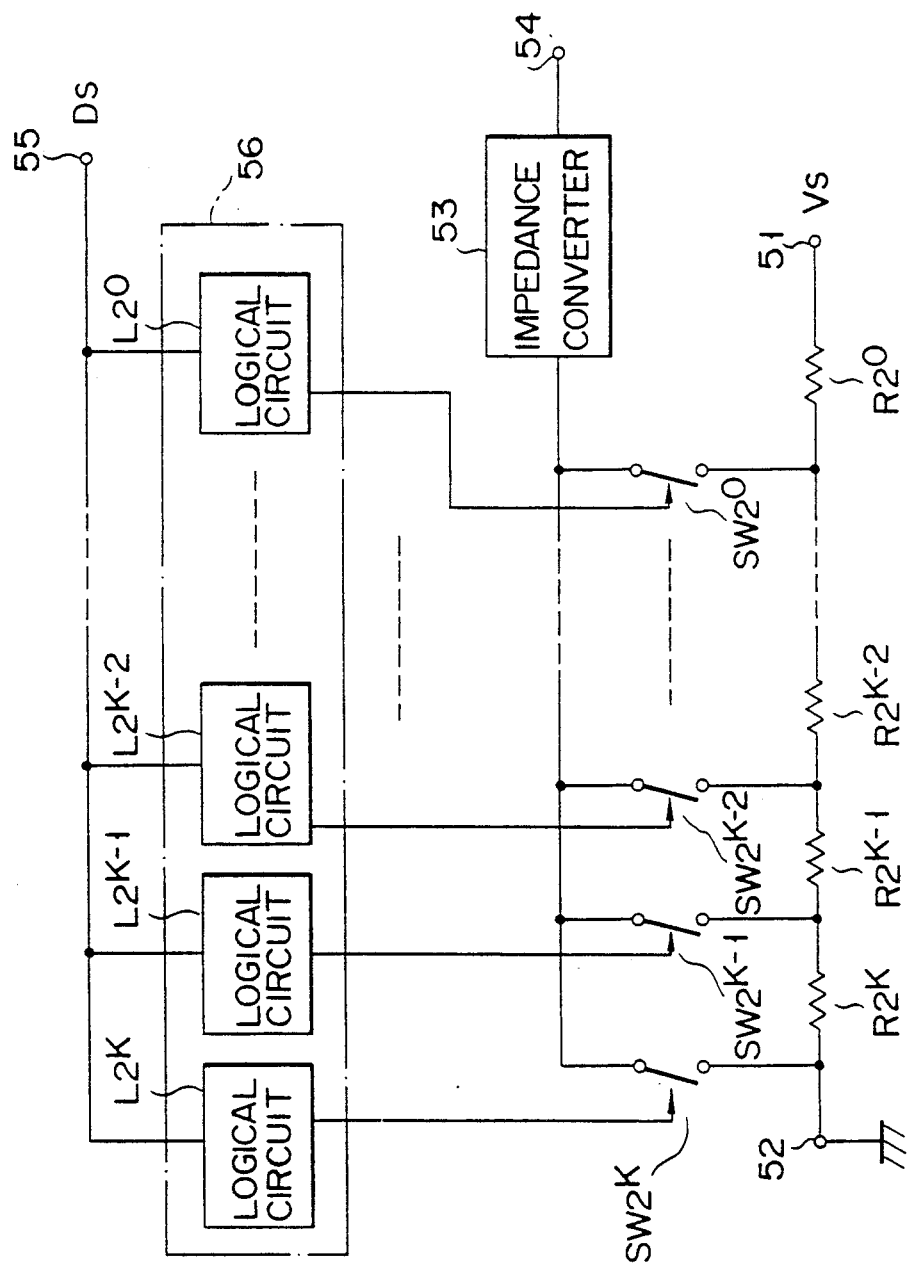
FIG. 5 is a circuit diagram showing a conventional D/A converter.

FIG. 4 show a second embodiment of the present invention.

In the second embodiment, first and second switch groups are controlled by the MSB of an input digital signal, whereas these are controlled by the LSB of an input digital signal in the first embodiment.

As shown in FIG. 4, resistors R1–R8 are connected between grounded terminal 12 and terminal 11 to which reference voltage Vref is applied. First switch group 31 is constituted by switches SW1, SW2, SW3, and SW4. An end of switch SW1 is connected to the connection node between resistors R1 and R2; an end of switch SW2 to the connection node between resistors R2 and R3; an end of switch SW3 to the connection node between resistors R3 and R4; and an end of switch SW4 to the connection node between resistors R4 and R5.

Second switch group 32 is constituted by switches SW5, SW6, SW7, and SW8. An end of switch SW5 is connected to the connection node between resistors R5 and R6; an end of switch SW6 to the connection node between resistors R6 and R7; an end of switch SW7 to the connection node between resistors R7 and R8; and an end of switch SW8 to the connection node between resistor R8 and terminal 12.

The other ends of switches SW1–SW8 constituting first and second switch groups 31 and 32 are connected switches SWc–SWf constituting third switch group 33. More specifically, the other ends of switches SW1 and SW5 are connected to an end of switch SWc; the other ends of switches SW2 and SW6 to an end of switch SWd; the other ends of switches SW3 and SW7 to an end of switch SWe; and the other ends of switches SW4 and SW8 to an end of switch SWf. The other ends of switches SWc–SWf are connected to output terminal 17 via impedance converter 16.

Input terminal $18_3$ which receives the MSB of a digital signal is connected via logical circuit L3 to first and second switch groups 31 and 32. More specifically, input terminal $18_3$ is connected to the gates of the N-channel transistors of switches SW1–SW4 and the gates of the P-channel transistors of switches SW5–SW8, and also connected via inverter 34 to the gates of the P-channel transistors of switch SW1–SW4 and the gates of the N-channel transistors of switches SW5–SW8.

Input terminals $18_2$ and $18_1$ which receive a signal consisting of the bits other than the MSB are connected to third switch group 33 through logical circuit L4 comprising NAND circuits $35_1$–$35_4$ and inverter circuits $36_1$–$36_4$, $37_1$, and $37_2$.

An input terminal of NAND circuit $35_1$ is connected to input terminal $18_2$, and the other input terminal thereof is connected to input terminal $18_1$. The output terminal of NAND circuit $35_1$ is connected to the gate of the P-channel transistor of SWc, and to the gate of the N-channel transistor of switch SWc via inverter $36_1$.

An input terminal of NAND circuit $35_2$ is connected to input terminal $18_1$ and the other input terminal thereof is connected to the output terminal of inverter $37_1$ whose input terminal is connected to input terminal $18_1$. The output terminal of NAND circuit $35_2$ is connected to the gate of the P-channel transistor of switch SWd, and to the gate of the N-channel transistor of switches SWd via inverter $36_2$.

An input terminal of NAND circuit $35_3$ is connected to the output terminal of inverter $37_2$ whose input terminal is connected to input terminal $18_2$, and the other input terminal thereof is connected to input terminal $18_1$. The output terminal of NAND circuit $35_3$ is connected to the gate of the P-channel transistor of switch SWe, and to the gate of the N-channel transistor of switch SWe via inverter $36_3$.

An input terminal of NAND circuit $35_4$ is connected to the output terminal of inverter $37_2$, and the other input terminal thereof is connected to the output terminal of inverter $37_1$. The output terminal of NAND circuit is connected to the gate of the P-channel transistor of switch SWf, and to the gate of the N-channel transistor of switch SWf via inverter $36_4$.

In the converter as described above, when signals A0="1", A1="0", A2="0" supplied to input terminals $18_1$, $18_2$ and $18_3$, respectively, switches SW5–SW8 are turned on, since signal A2 is "0". In addition, since only the output of NAND circuit $35_3$ is "0", with the result that only switch SWe is turned on, and a voltage $\tfrac{1}{3}$Vref is output from output terminal 17. Thus, the same effect as in the first embodiment can be attained in the second embodiment.

The converter of this embodiment comprises two more switches as compared to the first embodiment. Accordingly, the area of the chip is larger. However, each of switches SWc–SWf constituting third switch group 33 controls only two switches, in contrast to the first embodiment in which each of switches SWa and SWb constituting third switch group 15 controls four switches. Thus, since switches SWc–SWf have less loads than switches SWa and SWb, the operation speed is higher in the second embodiment than in the first embodiment.

In the second embodiment, first and second switch groups 31 and 32 are controlled by use of the other bits of the MSB of an input digital signal, and third switch group 33 is controlled by use of the MSB of the input digital signal. However, it is possible that third switch group 33 can be controlled by use of the LSB of an input digital signal, and first and second switch groups 31 and 32 can be controlled by use of the bits other than the LSB of the input digital signal.

The present invention is not limited to the above-described embodiments, and various changes and modifications can be made without departing from the spirit of the invention.

What is claimed is:

1. A D/A converter for converting a digital signal having first and second end bits into an analog signal, comprising:
    a plurality of resistors connected in series between first and second reference power sources, the resistors being connected at alternately odd-numbered and even-numbered connection nodes;
    first deriving means constituted by a plurality of deriving elements for deriving divided voltages from even-numbered connection nodes among the connection nodes between each adjacent pair of resistors;

second deriving means constituted by a plurality of deriving elements for deriving divided voltages from odd-numbered connection nodes among the connection nodes between each adjacent pair of resistors;

first selection means for selecting one of the deriving elements of the first deriving means having a first deriving voltage in accordance with the content of bits other than the first end bit of the digital signal and for selecting one of the deriving elements of the second deriving means having a second deriving voltage in accordance with the content of bits other than the first end bit of the digital signal; and second selection means for selecting one of the first and second deriving voltages in accordance with the content of the least significant bit of the digital signal.

2. An apparatus according to claim 1, wherein said deriving elements are switches.

3. An apparatus according to claim 2, wherein each of said switches comprises a pair of P- and N-channel MOS transistors.

4. An apparatus according to claim 1, wherein said first selection means comprises a decode circuit for decoding the content of bits other than the end bit of a digital signal.

5. An apparatus according to claim 1, wherein said second selection means is constituted by switches.

6. An apparatus according to claim 5, wherein each of said switches comprises a pair of P- and N-channel MOS transistors.

7. An apparatus according to claim 1, wherein the first end bit of the digital signal is the least significant bit.

8. A D/A converter for converting a digital signal having first and second bits into an analog signal, comprising:

a plurality of resistors connected in series between first and second reference power sources, the resistors being connected at alternately odd-numbered and even-numbered connection nodes;

first switch means constituted by a plurality of switches for deriving divided voltages from even-numbered connection nodes among the connection nodes between each adjacent pair of resistors;

second switch means constituted by a plurality of switches for deriving divided voltages from odd-numbered connection nodes among the connection nodes between each adjacent pair of resistors;

selection means for selecting one of the switches of the first switch means deriving a first divided voltage in accordance with the content of bits other than the first end bit of the digital signal and for selecting one of the switches of the second switch means deriving a second divided voltage in accordance with the content of bits other than the first end bit of the digital signal; and third switch means for selecting one of the first and second divided voltages in accordance with the content of the first end bit of the digital signal.

9. An apparatus according to claim 8, wherein the first end bit of the digital signal is the least significant bit.

* * * * *